United States Patent [19]
Cho

[11] Patent Number: 5,831,911
[45] Date of Patent: *Nov. 3, 1998

[54] SEMICONDUCTOR MEMORY DEVICE FOR REDUCING A STATIC CURRENT

[75] Inventor: Yong Chul Cho, Ichonshi, Rep. of Korea

[73] Assignee: Hyundai Electronics Industries Co., Ltd., Rep. of Korea

[*] Notice: The term of this patent shall not extend beyond the expiration date of Pat. No. 5,646,880.

[21] Appl. No.: 883,214

[22] Filed: Jun. 26, 1997

[30] Foreign Application Priority Data

Jun. 27, 1996 [KR] Rep. of Korea ................... 1996-24655

[51] Int. Cl.⁶ ..................................................... G11C 7/00
[52] U.S. Cl. ..................... 365/189.11; 365/195; 365/227; 365/230.03; 365/230.06
[58] Field of Search ............................... 365/189.11, 195, 365/230.03, 230.06, 227

[56] References Cited

U.S. PATENT DOCUMENTS

| | | | |
|---|---|---|---|
| 5,469,380 | 11/1995 | Iio | 365/154 |
| 5,574,695 | 11/1996 | Suzuki | 365/189.11 X |
| 5,646,880 | 7/1997 | Yuh | 365/189.11 X |
| 5,684,745 | 11/1997 | Kim et al. | 365/189.11 |

*Primary Examiner*—Do Hyun Yoo
*Attorney, Agent, or Firm*—Blakely Sokoloff Taylor & Zafman

[57] ABSTRACT

Present invention is to provide an semiconductor memory device capable of reducing a static current by turning off a bit line pull-up transistor at a write operation. A cell array divided to a plurality of cell blocks; a block decoder for selecting one of the cell blocks; a bit line for transferring a data between the cell and an external circuit; a bit line pull-up circuit for supplying the bit lines with power for preventing a data sensing error; and a bit line pull-up control circuit for disabling the bit line pull-up circuit of selected cell block at the write operation, to prevent a static current from being caused by the bit line pull-up circuit.

5 Claims, 4 Drawing Sheets

SEMICONDUCTOR MEMORY DEVICE FOR REDUCING A STATIC CURRENT

BACKGROUND OF THE INVENTION

1. Field of the Invention

The present invention relates to a semiconductor memory device having an apparatus controlling a bit line pull-up transistor, to reduce a static current.

2. Description of Prior Art

Generally, a conventional semiconductor memory device, such as static random access memory (SRAM), consists of a memory cells array divided into a plurality of cell blocks, having a block decoder for selecting a predetermined cell block.

FIG. 1 is a schematic diagram illustrating a configuration of a core circuit of a conventional SRAM device. As shown in FIG. 1, the SRAM device consists of a memory cell 15, a precharge and equalizing part 16, bit line selecting parts 13A and 13B, bit line pull-up parts 14A and 14B, an Y-decoder 12 and a block decoder 11.

The memory cell 15 is connected to bit lines BIT and BITB for forming a data path and to a word line WL. The precharge and equalizing part 16 includes PMOS transistors MP7 and MP9 to precharge the bit lines BIT and BITB and PMOS transistor MP8 to equalize the bit lines BIT and BITB. The PMOS transistors MP7, MP9 and MP8 are controlled in response to a precharge signal PEQB. The bit line pull-up parts 14A and 14B supplies the bit lines with power at all time to prevent a data sensing error from being caused by parasitic capacitance of bit lines. The bit line pull-up parts 14A and 14B include PMOS transistors MP1 and MP2 whose gate electrodes connected to a ground terminal, so that PMOS transistors MP1 and MP2 are always turned on. The bit line selecting parts 13A and 13B are controlled by output signals YD and YDB from the Y-decoder 12, and then the data bus lines DB and DBB are connected to the bit lines BIT and BITB, respectively. The block decoder 11, which includes an inverter I2 and a NAND gate I1 receiving an address signals A0 and A1, selects one of the cell blocks. The Y-decoder 12 selects the bit lines BIT and BITB in the selected cell block.

FIGS. 2A and 2B are timing diagrams illustrating each control signal in FIG. 1.

As shown in FIG. 2B, the word line WL is turned off in response to a pulsed word line signal PWL at a read operation, but in case of write operation, as shown in FIG. 2A, the word line WL is always turned on. That is, if block address signals A0 and A1 are at a high level, the cell block corresponding to the block address signals A0 and A1 are activated, and then the output signals YD and YDB from the Y-decoder 12 are at a high level and at a low level, respectively. Therefore, pass gate transistors MN5 and MP5 and an access transistor MN1 are turned on. At this time, if cell node CE is at a low level and cell node CEB is at a high level, a driver transistor MN2 is turned on. Accordingly, since a current path is formed through the bit line pull-up transistor MP1, the access transistor MN1 and the driver transistor MN2, a static current flows on the current path (an arrow in FIG. 1).

As a result, since one cell block consists of 128 memory cells, if turn-on current flowing on one cell is about 70 μA, the current of 8.96 mA flows on all of 128 memory cells connected to a selected word line. Therefore, a large power consumption occurs in the conventional SRAM device.

SUMMARY OF THE INVENTION

An object of the present invention is to provide a semiconductor memory device capable of reducing a static current, by turning off a bit line pull-up transistor at a write operation.

In accordance with an aspect of the present invention, there is a semiconductor memory device comprising a bit line for passing a data between a memory cell and the outside, a bit line pull-up means, supplying the bit lines with power for preventing a data sensing error and a bit line pull-up control means disabling the bit line pull-up means at a write operation, to prevent a static current from being caused by the bit line pull-up means.

In accordance with another aspect of the present invention, there is a semiconductor memory device comprising a cell array divided to a plurality of cell blocks, a block decoder for selecting one of the cell blocks, a bit line for passing a data between the cell and the outside, a bit line pull-up means, supplying the bit lines with power for preventing a data sensing error and a bit line pull-up control means disabling the bit line pull-up means of selected cell block at a write operation, to prevent a static currents from being caused by the bit line pull-up means.

BRIEF DESCRIPTION OF THE DRAWINGS

Other objects and aspects of the invention will become apparent from the following description of embodiments with reference to the accompanying drawings, in which.

DETAILED DESCRIPTION OF THE PREFERRED EMBODIMENTS

Hereinafter, an SRAM device according to a preferred embodiment of the present invention will be described in details referring to FIGS. 3, 4A and 4B.

Figure 1:
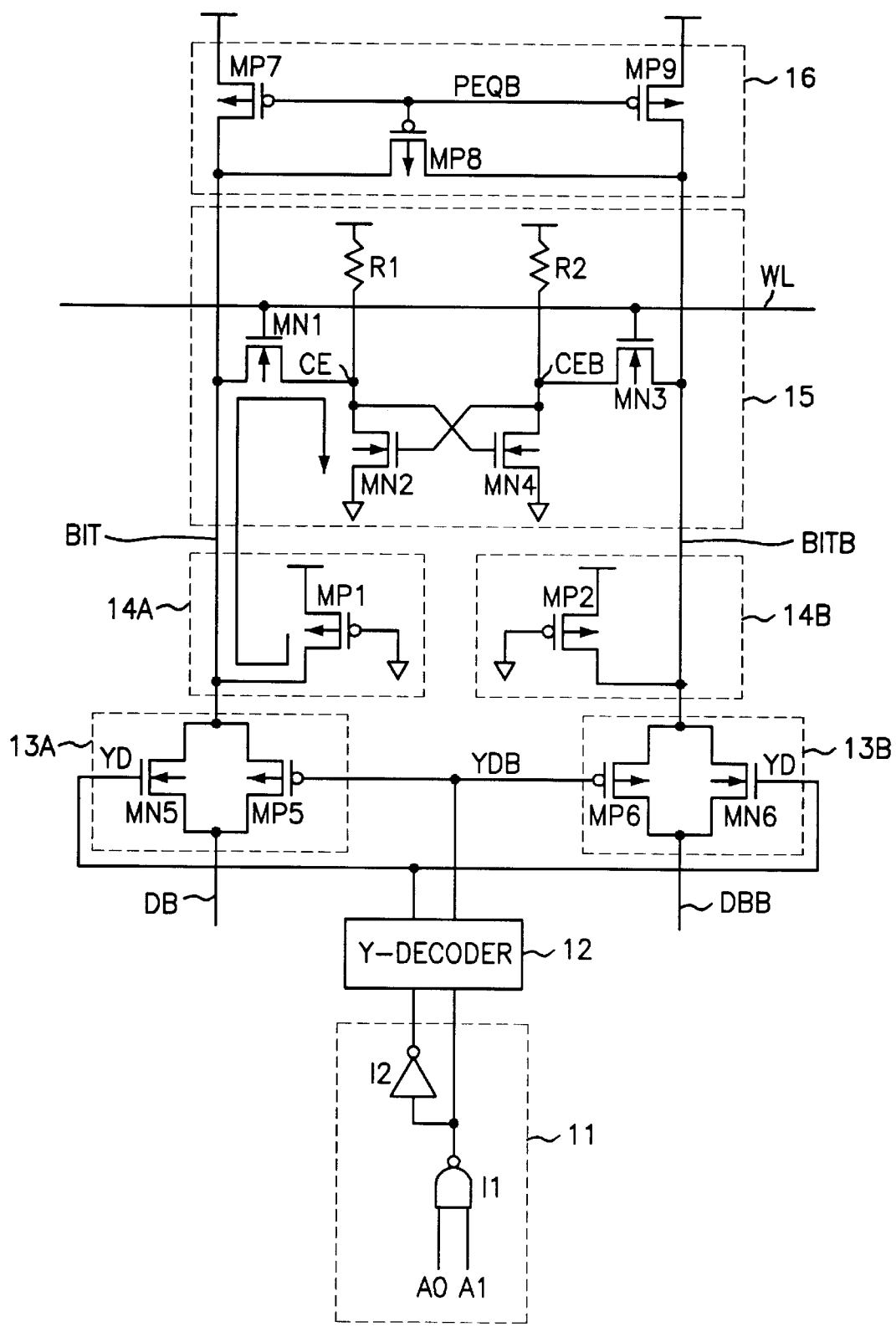
FIG. 1 is a schematic diagram illustrating a configuration of a core circuit of a conventional SRAM device.
Figure 2A:
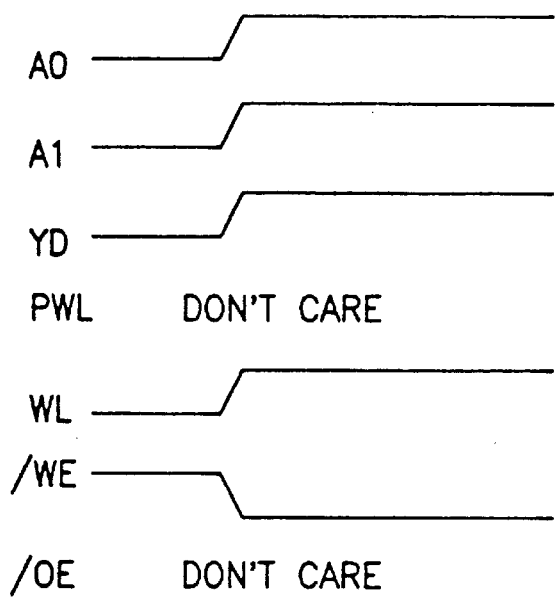
FIGS. 2A and 2B are timing diagrams illustrating each control signal in FIG. 1.
Figure 2B:
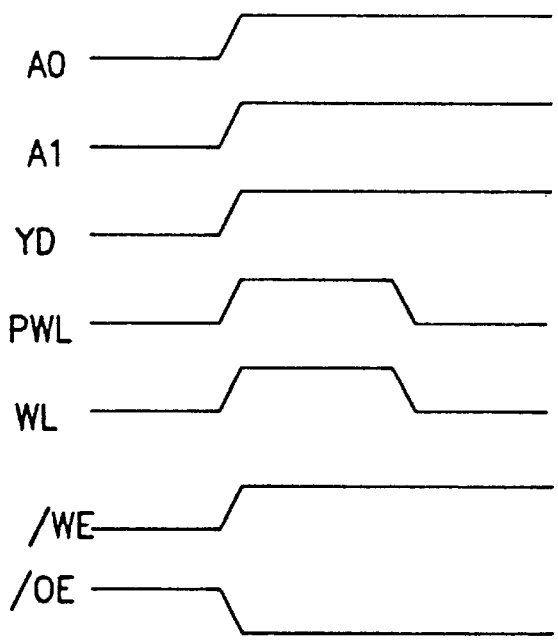
Figure 3:
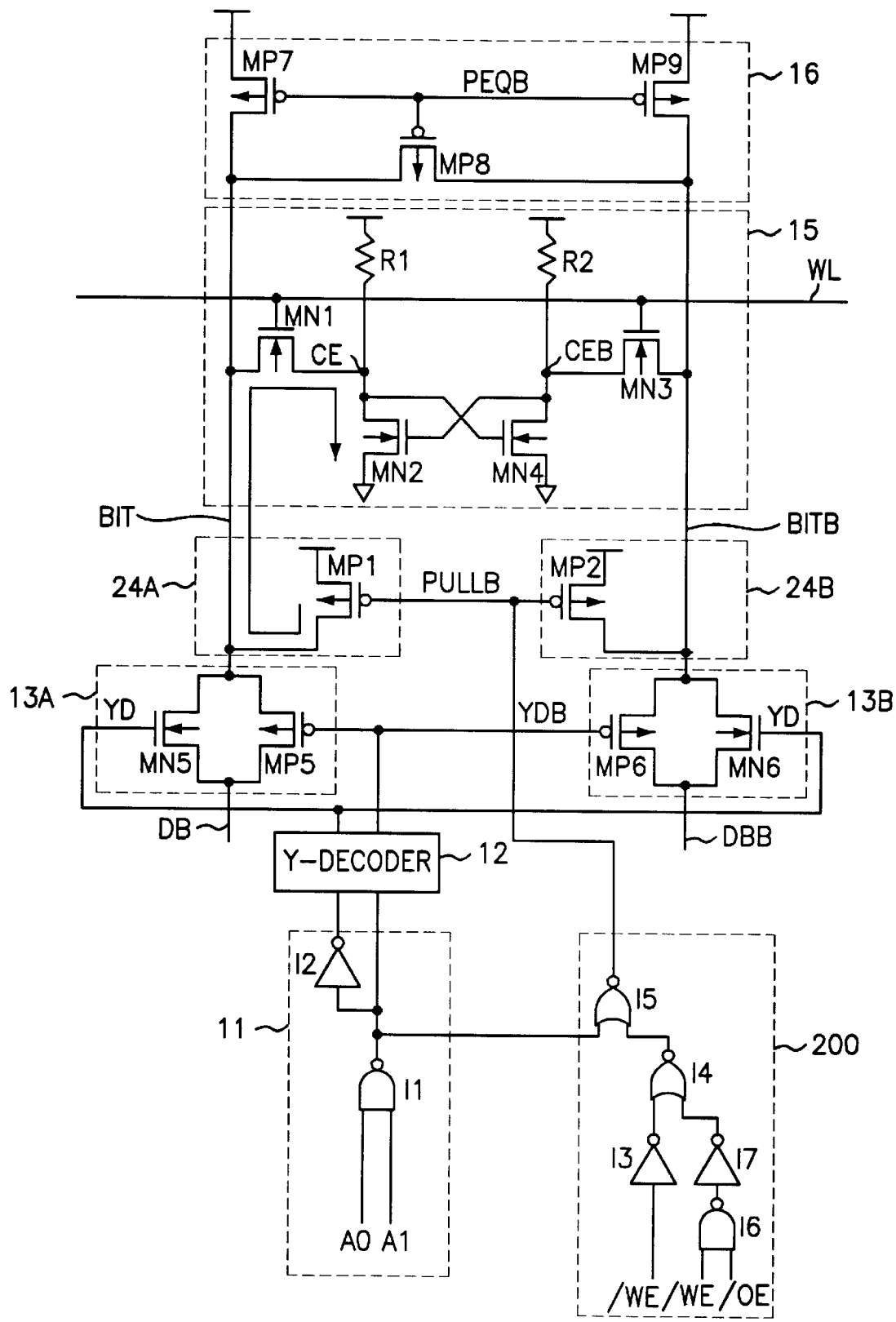
FIG. 3 is a schematic diagram illustrating a configuration of a core circuit in an SRAM device in accordance with an embodiment of the present invention.

First, FIG. 3 is a schematic diagram illustrating a configuration of an SRAM device in accordance with an embodiment of the present invention, in which the same elements as those in FIG. 1 are expressed as the same numerals.

As shown in FIG. 3, the SRAM device in accordance with the present invention includes a memory cell 15, a precharge and equalize part 16, a bit line selecting parts 13A and 13B, a bit line pull-up parts 24A and 24B, an Y-decoder 12, a block decoder 11 and a bit line pull-up control part 200.

Referring to FIG. 3, except for the bit line pull-up parts 24A and 24B and the bit line pull-up control part 200, the SRAM device is similar to that shown in FIG. 1. Therefore the bit line pull-up parts 24A and 24B and the bit line pull-up control part 200 will be described.

The bit line pull-up parts 24A and 24B respectively include PMOS transistor MP1 and MP2, which connects a power supply terminal with the bit lines so as to supply the bit lines with power in response to an output of the bit line pull-up control part 200.

The bit line pull-up control part 200 enables or disables the bit line pull-up parts 24A and 24B in response to a write enable signal /WE and an output enable signal /OE. That is, PMOS transistor MP1 and MP2 are turned off by the bit line pull-up control part 200 at a write operation.

The bit line pull-up control part 200 includes a NAND gate I6 receiving the write enable signal /WE and the output enable signal/OE, an inverter I3 receiving the write enable signal/WE, an inverter I7 receiving the output from the NAND gate I6, a NOR gate I4 receiving the outputs from the inverters I3 and I7, and a NOR gate I5 receiving outputs from the NOR gate I4 and the NAND gate I1 receiving an address signals A0 and A1. Of course, the NAND gate I1 is one element of a block decoder 11.

Similarly, a block decoder 11 includes the NAND gate I1 and an inverter I2 inverting the output from the NAND gate I1.

Figure 4A:
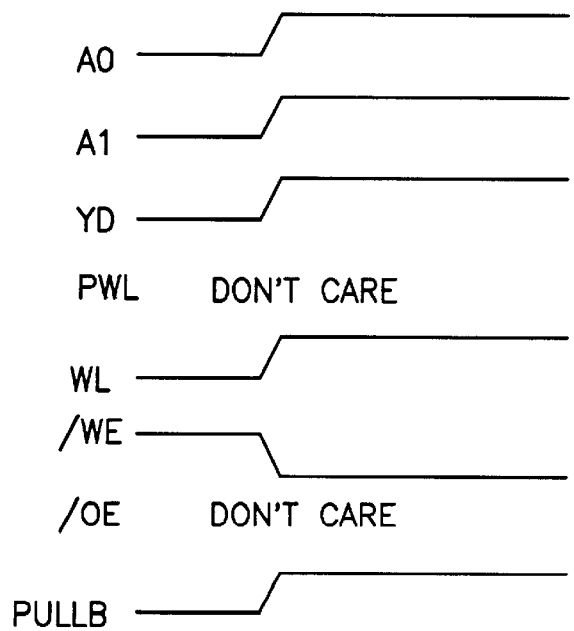
FIGS. 4A and 4B are timing diagrams illustrating each control signal of SRAM device in FIG. 3.
Figure 4B:
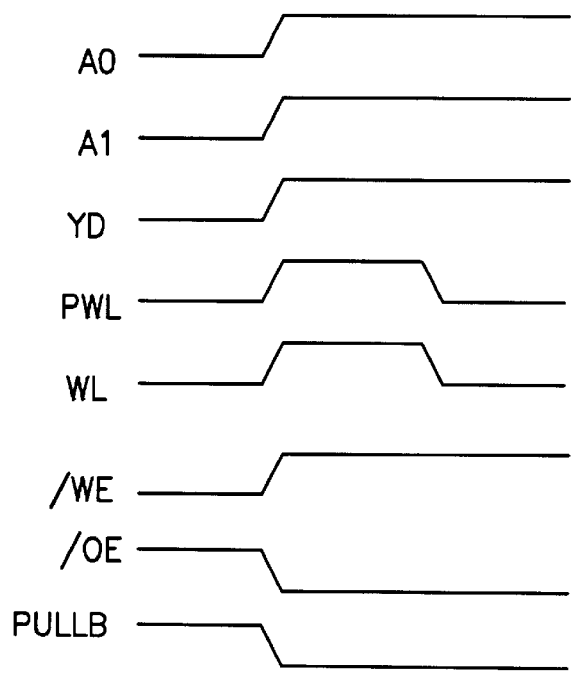

FIGS. 4A and 4B are timing diagrams illustrating each control signal in SRAM device in FIG. 3. A write operation will be illustrated in detail referring to FIGS. 3, 4A and 4B.

First, if the low-to-high logic transition is achieved at the address signals A0 and A1, the cell block corresponding to the block address signal A0 and A1 is activated, output signals YD and YDB from the Y-decoder 12 is at a high level and at a low level, respectively. Therefore a pass gate transistors MN5 and MP5 and an access transistor MN1 are turned on. At this time, if a write operation is achieved (write enable signal/WE is at a low level), the pull-up transistor MP1 and MP2 are turned off, because an output signal PULLB, which is outputted from the bit line pull-up control part 200, is at a high level.

Accordingly, as shown in FIG. 4A, the static current, which flows through all cells in a selected cell block at a write operation, is reduced, because the current path (an arrow in FIG. 3), which is formed through the bit line pull-up transistor MP1, the access transistor MN1 and a driver transistor MN2, is blocked.

On the other hand, in an unselected cell block, pull-up transistors are turned on, but the static current on the current path doesn't flow because the access transistors MN1 in each cell are turned off. Also, as shown in FIG. 4A, at read operation, a word line of a selected cell block is enabled by a pulsed word line signal PWL, which is generated by the transition of the address signals, so that the static current is blocked.

As a result, at the write operation, all pull-up transistors in the selected cell block are turned off, when the word line is activated by the write enable signal/WE, irrespective of the pulsed word line signal PWL. Therefore, at the write operation, the static currents caused by the pull-up transistors in the selected cell block is blocked.

As apparent from above description, the present invention has a effect on the reduction of the power consumption, by disabling the bit line pull-up transistor at the write operation of the SRAM devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A SRAM device comprising:

a plurality of bit line pairs;

a cell array for data storage, divided into a plurality of cell blocks and connected to the plurality of bit line pairs;

a precharge and equalize means for precharging and equalizing the bit line pairs;

a block decoder for selecting one of the cell blocks in response to column addresses;

a column decoder for selecting one of the plurality of bit line pairs in response to an output signal from the block decoder;

a data line pair for transferring a data between the bit line pair and a data input/output buffer;

a column gate for switching between the bit line pair and the data line pair in response to an output signal from the column decoder;

a bit line pull-up means for supplying the bit line pair with power supply, wherein the bit line pull-up means in a selected cell block is disabled in response to a control signal so that a static current flowing from the bit line pull-up means into each cell of the selected cell block is reduced; and a control means for outputting the control signal for disabling or enabling the bit line pull-up means in response to a write enable signal and an output enable signal and the output signal of the block decoder.

2. The SRAM device in accordance with claim 1, wherein the bit line pull-up means comprises a PMOS transistor, which connects a power supply terminal to the bit line pair.

3. The SRAM device in accordance with claim 2, wherein the block decoder comprises a first NAND gate receiving the column addresses and a first inverter inverting an output from the first NAND gate.

4. The SRAM device in accordance with claim 3, wherein the control means comprises;

a second NAND gate receiving the write enable signal and the output enable signal;

a second inverter receiving the write enable signal;

a third inverter receiving an output from the second NAND gate;

a first NOR gate receiving outputs from the second inverter and the third inverter; and a second NOR gate receiving outputs from the first NOR gate and the first NAND gate and outputting to a gate terminal of the PMOS transistor.

5. The SRAM device in accordance with claim 1, wherein a word line of the selected cell block is enabled by a pulsed word line signal at a read operation, wherein the pulsed word line signal is generated by the transition of address signals.

* * * * *